(12) United States Patent
Jin et al.

(10) Patent No.: US 8,334,662 B2
(45) Date of Patent: Dec. 18, 2012

(54) ADAPTIVE SWITCH MODE LED DRIVER

(75) Inventors: Xuecheng Jin, Palo Alto, CA (US); Yu Cheng Chang, Cupertino, CA (US); Yang Li, Santa Clara, CA (US); Maofeng Lan, Palo Alto, CA (US); John W. Kesterson, San Jose, CA (US); Xiaoyan Wang, Milpitas, CA (US); Chenghung Pan, Palo Alto, CA (US)

(73) Assignee: iWatt Inc., Campbell, CA (US)

( * ) Notice: Subject to any disclaimer, the term of this patent is extended or adjusted under 35 U.S.C. 154(b) by 537 days.

(21) Appl. No.: 12/558,275

(22) Filed: Sep. 11, 2009

(65) Prior Publication Data

US 2011/0062872 A1 Mar. 17, 2011

(51) Int. Cl.
G05F 1/00 (2006.01)
H05B 37/02 (2006.01)
H05B 39/04 (2006.01)
H05B 41/36 (2006.01)

(52) U.S. Cl. ........ 315/299; 315/291; 315/294; 315/300; 315/301

(58) Field of Classification Search .................. None
See application file for complete search history.

(56) References Cited

U.S. PATENT DOCUMENTS

| | | | |
|---|---|---|---|
| 6,538,394 B2 | 3/2003 | Volk et al. | |
| 6,618,031 B1 | 9/2003 | Bohn, Jr. et al. | |
| 6,864,641 B2 | 3/2005 | Dygert | |
| 7,071,630 B1 | 7/2006 | York | |
| 7,122,971 B2 | 10/2006 | Yeh et al. | |
| 7,148,632 B2* | 12/2006 | Berman et al. | 315/189 |
| 2008/0116818 A1 | 5/2008 | Shteynberg et al. | |
| 2009/0021384 A1* | 1/2009 | Jacubovski et al. | 340/653 |
| 2009/0322234 A1 | 12/2009 | Chen et al. | |

FOREIGN PATENT DOCUMENTS

| | | |
|---|---|---|
| KR | 10-2004-0037301 | 5/2004 |
| KR | 10-0628717 | 9/2006 |
| KR | 10-0665369 | 12/2006 |
| KR | 10-2009-0056566 | 6/2009 |

OTHER PUBLICATIONS

Korean Patent Office, Notice of Preliminary Rejection, Korean Patent Application No. 10-2010-0030285, Apr. 22, 2011, six pages.
Linear Technology Corporation, "Triple Output LED Driver" LT3496 Datasheet, 2007, 16 Pages.

(Continued)

*Primary Examiner* — Anh Tran
(74) *Attorney, Agent, or Firm* — Fenwick & West LLP

(57) ABSTRACT

An adaptive switch mode LED driver provides an intelligent approach to driving multiple strings of LEDs. The LED driver determines an optimal current level for each LED channel from a limited set of allowed currents. The LDO driver then determines a PWM duty cycle for driving the LEDs in each LED channel to provide precise brightness control over the LED channels. Beneficially, the LED driver minimizes the power dissipation in the LDO circuits driving each LED string, while also ensuring that the currents in each LED string are maintained within a limited range. A sample and hold LDO allows PWM control over extreme duty cycles with very fast dynamic response. Furthermore, fault protection circuitry ensures fault-free startup and operation of the LED driver.

26 Claims, 9 Drawing Sheets

OTHER PUBLICATIONS

Maxim Integrated Products, "Six-String White LED Driver with Active Current Balancing for LCD Panel Applications," MAX8790 Datasheet, Nov. 2006, 24 Pages.

Reatti, A., et al., Small-Signal Model of PWM Converters for Discontinuous Conduction Mode and Its Application for Boost Converter, IEEE Transactions on Circuits and Systems—I: Fundamental Theory and Applications, Jan. 2003, pp. 65-73, vol. 50, No. 1.

Scharf, G., "Behaviour of InGaN LEDs in Parallel Circuits: Application Note," OSRAM, May 17, 2002, 4 Pages.

Vopérian, V., "Simplified Analysis of PWM Converters Using Model of PWM Switch Part I: Continuous Conduction Mode," IEEE Transactions on Aerospace and Electronic Systems, May 1990, pp. 490-496, vol. 26, No. 3.

Vopérian, V., "Simplified Analysis of PWM Converters Using Model of PWM Switch Part II: Discontinuous Conduction Mode," IEEE Transactions on Aerospace and Electronic Systems, May 1990, pp. 497-505, vol. 26, No. 3.

* cited by examiner

ADAPTIVE SWITCH MODE LED DRIVER

BACKGROUND OF THE INVENTION

1. Field of the Invention

The present invention relates to an LED (light-emitting diode) driver and, more specifically, to an LED driver controller that supports multiple strings of LEDs.

2. Description of the Related Arts

LEDs are being adopted in a wide variety of electronics applications, for example, architectural lighting, automotive head and tail lights, backlights for liquid crystal display devices including personal computers and high definition TVs, flashlights, etc. Compared to conventional lighting sources such as incandescent lamps and fluorescent lamps, LEDs have significant advantages, including high efficiency, good directionality, color stability, high reliability, long life time, small size, and environmental safety.

LEDs are current-driven devices, and thus regulating the current through the LEDs is an important control technique. To drive a large array of LEDs from a direct current (DC) voltage source, DC-DC switching power converters such as a boost or buck-boost power converters are often used to supply the top rail voltage for several strings of LEDs. In Liquid Crystal Display (LCD) applications using LED backlights, it is often necessary for a controller to control several strings of LEDs with independent current settings for each string. The controller can then independently control the brightness of different sections of the LCD. Furthermore, the controller can turn different parts of the LCD on or off in a timed manner.

FIG. 1 illustrates a conventional LED driver 100. LED driver 100 includes a boost DC-DC power converter 101 coupled between DC input voltage Vin and multiple strings of LEDs 102 (i.e., LED channels). The output Vboost of boost converter 101 is coupled to the anode of the first LED in each LED string 102. The cathode of the last LED in each string 102 is coupled to channel controller 115 for controlling the current in the string 102.

Each channel controller 115 comprises a PWM transistor 103 coupled in series with a Linear Drop Out regulator (LDO) 104. LDO 104 ensures that the peak current in LED string 102 is regulated to a fixed level. The peak current level is normally set to the same value as indicated by signal 108 for all LED channels by LDO reference controller 107. PWM transistor 103 controls the brightness of LED string 102 according to a Pulse Width Modulated (PWM) duty cycle. The brightness is set independently for each LED channel by luminance control signals 111 from luminance controller 109 that adjusts the PWM duty cycle according to the set brightness.

In this conventional configuration, power is dissipated in LDOs 104 to regulate the peak current. LEDs are current controlled devices, meaning that the luminous flux generated from them is primarily a function of the current applied through them. Thus, LDOs 104 ensure that the brightness of each LED channel will be the same because the peak current through each LED channel is the same. LDOs 104 also provide a native power supply rejection that reduces the impact of the boost voltage ripple from Vboost on the luminance of LED strings 102. In each LED channel, LDO 104 dissipates power proportional to the product of the current through LED string 102, the PWM duty cycle, and the voltage drop across LDO 104.

Due to manufacturing differences between the LEDs, the voltage drop across each LED string 102 necessary to maintain a specified current level varies considerably. To compensate for the different forward voltages LED strings 102, different voltage drops are seen across each LDO 104. The VI curve of FIG. 2 illustrates the exponential relationships between voltage and current for two different LEDs (LED1 and LED2). Assuming, for example, that LDO reference controller 107 sets the peak current in each LED channel to 40 mA, LED1 must operate at a forward voltage drop of about 3.06 volts, while LED2 must operate at a forward voltage drop of about 3.26 volts. Thus, there is a difference between the forward voltage drops of LED1 and LED2 of about 0.2 volts. Assuming there are 10 LEDs having the characteristics of LED1 in a first LED string 102, there is a 30.6 V drop across the string 102. Assuming there are 10 LEDs having the characteristics of LED2 in a second LED string 102, there is a 32.6 V drop across the second LED string 102. This difference of 2 volts will therefore be dissipated by the LDO that is driving the second string such that both strings operate at the same peak current of 40 mA. The total power dissipated is 80 mW. When these power losses are extended over many LED channels, they can become prohibitive.

An alternative approach to LED driver 100 of FIG. 1 uses current mirrors that each drive one LED string, as described, for example, in U.S. Pat. No. 6,538,394 issued to Volk et al. However, this current mirror approach suffers from low power efficiency. When the forward voltages of the LEDs differ, Vboost applied to the parallel-connected LED strings has to be higher than the forward voltage drop across the LED string with the highest combined forward voltage $\Sigma V_F$. There is a voltage difference (Vboost-$\Sigma V_F$) in the LED strings with a combined forward voltage lower than the highest, and this voltage difference is applied across each current mirror. Since the power dissipated by the current mirrors does not contribute to lighting, the overall efficiency is low, especially when the difference in the combined forward voltage between the LED strings is large.

A third conventional approach operates by turning on each of the multiple LED strings sequentially, as described in U.S. Pat. No. 6,618,031 issued to Bohn, et al. However, this approach requires fast dynamic response from the LED driver, and thus forces the power converter to operate in deep discontinuous mode (DCM), under which power conversion efficiency is low.

Yet another approach is to operate in a full digital switch mode without any LDO, as described in U.S. patent application Ser. No. 12/164,909 by Yuhui Chen, et al. filed on Jun. 30, 2008. In this approach, a PWM controller automatically adjusts the PWM duty cycle for each string to compensate for the varying peak currents. However, this approach results in a wide variation of LED currents between LED strings and leads to LED component stress and reliability control issues. Additionally, this conventional solution does not provide any native power supply rejection to the boost controller ripple, and thus complicates ADC and digital signal processing requirements.

SUMMARY OF THE INVENTION

Embodiments of the present invention include an adaptive switch mode LED driver that programmatically controls current regulation through one or more LED strings. The adaptive switch mode LED driver comprises a power converter (e.g., a boost converter) configured to receive an input voltage and generate an output voltage applied to the LED strings. A first channel switch (e.g., a PWM switch) coupled in series with a first LED string switches the LED string on or off according to a first duty cycle signal for the first switch. A first channel regulator (e.g., a low dropout regulator) coupled in series with the first channel switch and the first LED string is configured to receive a first programmed current level signal and regulate current through the LED string according to the programmed current level signal. A luminance controller is configured to generate the programmed current level signal to correspond to one of a limited set of programmable current levels. The luminance controller furthermore generates the duty cycle signal for driving the channel switch as a function of the programmed current level. The LED driver can similarly drive additional LED strings having different current-voltage characteristics. The luminance controller can set different programmed currents for different LED strings, and set different duty cycles for each LED string to compensate for the current variations and the different I-V characteristics between LED strings.

Beneficially, the LED driver provides precise control over the relative brightness outputs between LED channels while still allowing for current variations between channels. By allowing some current variations, the LED driver can operate each LED channel at a peak current that provides optimal power efficiency. At the same time, the LED driver limits these current differences between LED channels to a pre-defined range, thereby reducing problems with component stress and reliability.

Embodiments of the present invention also include a method for selecting the programmed current for each LED channel during a calibration stage of the LED driver. In one embodiment of the calibration method, the supply voltage is first adjusted such that the weakest LED channel operates at or near a desired baseline current level. The programmed current level for each LED string is then set to the highest programmable current level at which the LED string can maintain regulation of the programmed current under the channel supply voltage.

In one embodiment, the luminance controller generates the duty cycle signal for driving the LED strings using a luminance transfer function such that brightness output can be precisely matched between LED strings configured with the same brightness input settings. Additionally the luminance transfer function can include a temperature compensation component to compensate for temperature variations between LED channels.

Embodiments of the present invention also include a sample and hold current regulator for regulating currents in the LED strings. The sample and hold regulator samples the gate voltage of the regulator pass transistor prior to the channel switch turning off and holds the voltage until the channel switch turns back on. The sample and hold regulator beneficially allows PWM control over extreme duty cycles with very fast dynamic response.

Embodiments of the present invention also include a fault protection circuit to detect open circuit faults or short circuit faults. Any LED channels where faults are detected are disabled from further operation.

Embodiments of the present invention also include a method for manufacturing an LED driver. The on-resistance of the PWM transistor is measured during the manufacturing process. If the on-resistance is higher than a baseline resistance, the gate supply driver is trimmed to a higher voltage such that the measured resistance will match the baseline resistance. This process ensures minimal silicon area usage for the design of the PWM switch transistor.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present invention can be readily understood by considering the following detailed description in conjunction with the accompanying drawings.

DETAILED DESCRIPTION OF EMBODIMENTS

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

In general, an adaptive switch mode LED driver intelligently drives multiple strings of LEDs according to various embodiments. The LED driver determines an optimal current level for each LED channel from a limited set of allowed currents. The LED driver then determines a PWM duty cycle for driving the LEDs in each LED channel to compensate for the current variations between each LED channel and maintain control over the relative brightness outputs of the LED channels. Beneficially, the LED driver minimizes power dissipation in the LDO circuits driving each LED string, while also ensuring that the currents in each LED string are maintained within a fixed range.

LED Driver Architecture

Figure 3:
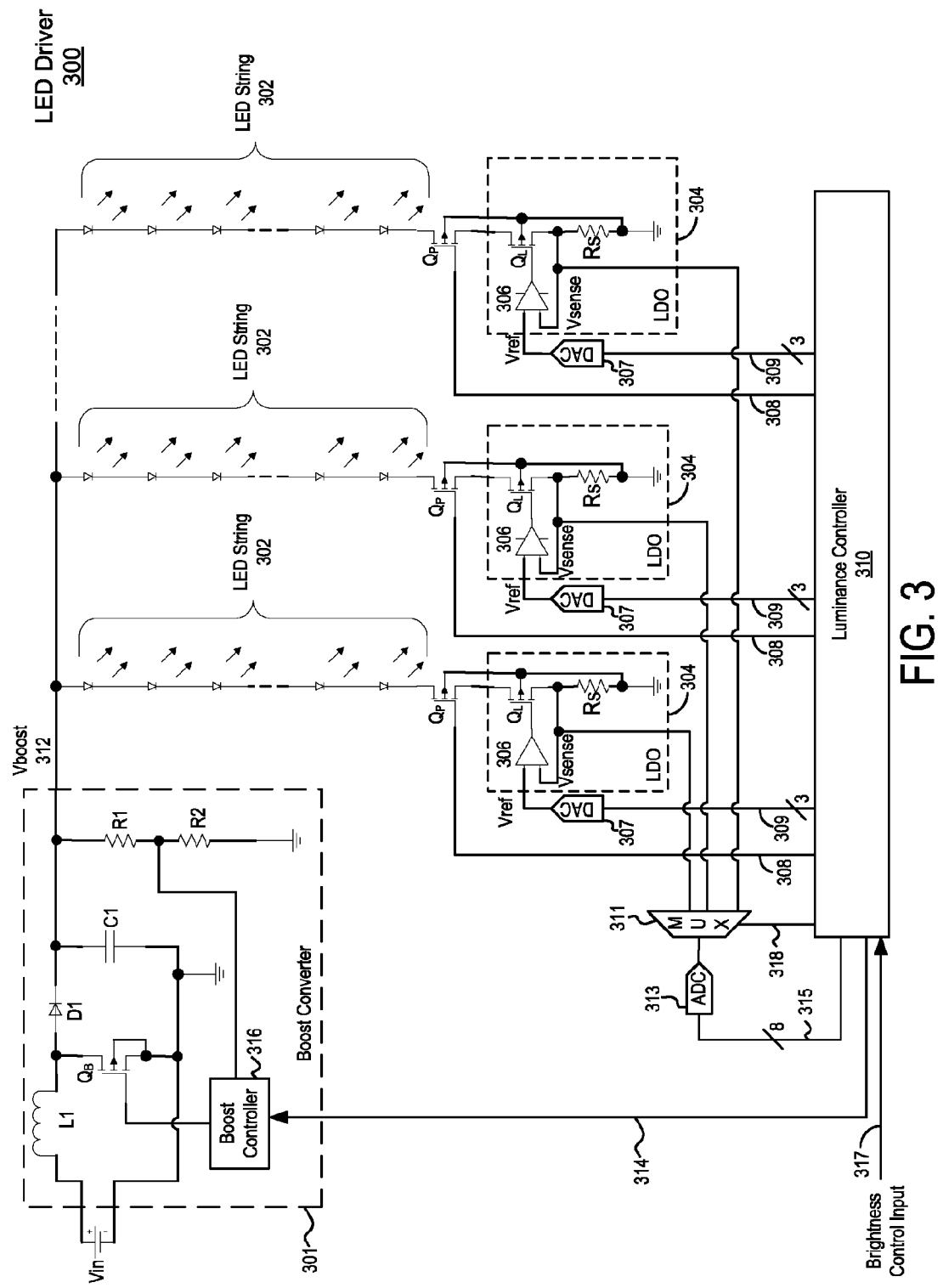
FIG. 3 is a circuit diagram illustrating an adaptive switch mode LED driver according to a first embodiment of the present invention.

FIG. 3 is a circuit diagram of a first embodiment of an adaptive switch mode LED driver 300. The embodiment comprises boost converter 301 driving one or more parallel LED channels. In each LED channel, LED string 302 is coupled in series with an LDO 304 for regulating current through LED string 302. LED string 302 and LDO 304 are also both coupled in series with PWM switch $Q_P$ (e.g., an NMOS transistor) for controlling the on-times and off-times of the LEDs in LED string 302. Luminance controller 310 controls the luminance output of each LED channel independently by controlling PWM switches $Q_P$ via control signals 308, and by controlling LDOs 304 via control signals 309 and digital-to-analog converters (DACs) 307. The LDOs 304 output feedback control signal 315 to luminous controller 310 via multiplexer 311 and ADC 313. Luminance controller 310 also outputs control signal 314 to boost converter 301 for controlling Vboost voltage 312. Although FIG. 3 illustrates only three LED channels, LED driver 300 can include any number of LED strings 302 and corresponding control/regulation circuitry.

Boost Converter

Boost converter 301 receives an input voltage Vin and provides regulated power to LED strings 302. In one embodiment, boost converter 301 comprises inductor L1, diode D1, capacitor C1, switch $Q_B$ (e.g., an NMOS transistor), resistors R1, R2, and boost controller 316. Boost controller 316 controls the duty cycle of switch $Q_B$. The input power from supply voltage Vin is stored in inductor L when switch $Q_B$ turns on because diode D1 becomes reverse biased. The input power is transferred to Vboost across capacitor C1 when switch $Q_B$ turns off because diode D1 becomes forward biased.

The output voltage Vboost is applied to the strings of LEDs 302 to provide current through the LEDs. Boost controller 316 senses Vboost via a voltage divider comprising resistors R1 and R2 and controls switching of $Q_B$ to regulate Vboost. Boost controller 316 can employ any one of a number of well known modulation techniques, such as pulse-width-modulation (PWM) or pulse frequency-modulation (PFM), to control the on and off states and duty cycles of switch $Q_B$. PWM and PFM are conventional techniques used for controlling the switching power converters by controlling the widths or frequencies, respectively, of the output drive pulse driving the switch $Q_B$ to achieve output power regulation. This feedback loop allows boost converter 301 to maintain Vboost at a programmed level set by boost controller 316.

Linear Dropout Regulator (LDO)

LDO 304 regulates current through the LED strings 302 according to programmed current levels for each LED channel. Each LDO 304 comprises operational amplifier (op-amp) 306, sense resistor $R_S$, and pass transistor $Q_L$ (e.g., an NMOS transistor). Pass transistor $Q_L$ and sense resistor $R_S$ are coupled in series between PWM switch $Q_P$ and a ground terminal. The output of op-amp 306 is coupled to the gate of pass transistor $Q_L$ to control current through the LDO 304. Op-amp 306 receives positive input signal Vref from DAC 307 and receives negative input signal Vsense via a negative feedback loop from the source of pass transistor $Q_L$.

LDO 304 comprises a feedback loop that senses the current through the LED string via Vsense and controls the pass transistor $Q_L$ to maintain the sensed current at the programmed current level set by Vref. Op-amp 306 compares Vref to Vsense. If Vref is higher than Vsense, op-amp 306 increases the gate voltage applied to pass transistor $Q_L$, increasing current flow through sense resistor $R_S$ and LED string 302 until it stablizes at Vref. If Vsense becomes higher than Vref, then op-amp 306 decreases the gate voltage applied to pass transistor $Q_L$, decreasing current flow through $R_S$ and causing Vsense to drop until it stabilizes at Vref. Thus, LDO 304 uses a feedback loop to maintain Vsense at Vref, thereby maintaining the current through the LED string 302 to a fixed value proportional to Vref.

Luminance Controller and Control Logic

Luminance controller 310 monitors characteristics of each LED channel and sets the peak currents and PWM duty cycles to maintain brightness matching between LED channels and optimize power efficiency. Luminance controller 310 outputs control signals 308, 309, 318, 314 to control LDOs 304, PWM switches $Q_P$, multiplexer 311, and boost converter 301 respectively. Luminance controller 310 also receives feedback signal 315 from LDOs 304 and a brightness control input 317.

Control signals 309 digitally set the outputs of DACs 307, which in turn provides the analog reference voltage Vref that sets the programmed current through LED strings 302. In one embodiment, control signal 309 is a 3 bit DAC word that allows for 8 possible programmable currents. For example, in one embodiment each LED channel can be set for a current in the range 40 mA to 54 mA in 2 mA increments. Luminance controller 310 determines the programmed current for each LED channel during a calibration stage as will be described below. The accuracy of DAC 307 can be better than 10 bits to provide very good matching between LED channels. Luminance controller 310 controls each LED channel independently such that different LED channels can be configured for different programmed currents.

Control signals 308 digitally control PWM switches $Q_P$ for each LED channel according to a PWM duty cycle for the LED channel. Luminance controller 310 determines the PWM duty cycle for each LED channel as a function of the programmed current during the calibration stage as will be described below. Luminance controller 310 controls the duty cycle of each LED channel independently such that different LED channels can be configured for different PWM duty cycles. The PWM duty cycle and programmed current for a given LED channel collectively determine the brightness output of the LEDs in the LED channel.

Control signal 318 controls switching of multiplexer 311. Luminance controller 310 sequentially monitors feedback signals from the different LED channels via ADC 313 by switching the select line 318 of the multiplexer 311. The luminance controller 310 uses the feedback signal 315 from multiplexer 311 in the calibration stage described in more detail below.

Control signal 314 controls boost controller 316 which in turn sets supply voltage Vboost during the calibration stage described below. Control signal 314 can set Vboost in any number of conventional ways such as, for example, by adding a current into the junction of the feedback resistors R1, R2, or by sending a digital message that causes alteration of the reference inside boost controller 316.

Luminance controller 310 receives external brightness input 317 that specifies a relative brightness input $BI_n$ for each channel n. In one embodiment, the brightness input $BI_n$ expresses the desired relative brightness for each LED channel n as percentage of a predefined maximum brightness (e.g., $BI_1=60\%$, $BI_2=80\%$, $BI_3=100\%$, etc). The luminance controller 310 uses the brightness input $BI_n$ as a baseline duty cycle for the channel because the brightness output of a channel is directly proportional to the duty cycle. Thus, for example, a brightness input $BI_n$ of 60% indicates a baseline duty cycle for the channel n of 60% of the maximum duty cycle (corresponding to the maximum brightness). However, the luminance controller 310 modifies this baseline duty cycle when generating the duty cycle signal 308 driving PWM switch $Q_P$ by a compensation factor to compensate for the known current variations between LED channels and maintain the desired relative brightness. This compensation factor and the resulting duty cycle signal 308 is determined during the calibration process described below.

Luminance Controller Calibration Stage

Luminance controller 310 enters a calibration stage at the beginning of operation (e.g., shortly after startup) to determine the peak current and PWM duty cycle for each LED channel. Each LED channel is set independently to compensate for manufacturing variations between the LED strings 302 and maintain the relative brightness outputs between LED channels set by the external brightness input 317. Thus, the luminance controller 310 ensures that channels configured with the same brightness inputs have substantially matching brightness outputs.

In one embodiment of the calibration stage, luminance controller 310 initially sets DACs 307 for each LED channel to their maximum possible levels. Vboost is then incrementally increased (via control signal 314) until all of the LED channels operate at or above a predefined master current level Iset (e.g., Iset=40 mA). The weakest channel (i.e. the LED channel with the greatest forward voltage drop across the LED string 302) will operate at or near Iset, while other channels may operate at higher current levels due to the different I-V characteristics of the LED strings 302. Luminance controller 310 then calibrates each LED channel one at a time. For each channel calibration, luminance controller 310 configures multiplexer 311 to select the LED channel and ADC 313 samples the current (via Vsense) for the selected LED channel. The luminance controller 310 rounds the sensed current down (i.e. quantizes) to the nearest possible current level programmable by the DAC 307 (e.g., one of 8 possible programmable currents) and stores the quantized current level as $I_n$ for the channel n. The current $I_n$ will correspond to the highest current from the set of possible programmable currents that the LED channel n can maintain under the supply voltage Vboost. This calibration process repeats to determine a programmed current level $I_n$ for each of the LED channels n. During normal operation following calibration, each LED channel n is set to the determined programmed current $I_n$.

The calibration process generally ensures that each LDO 304 is operating below but near the saturation point of each LDO 304 for best power efficiency. In the worst case instances when the saturation current is higher than the maximum DAC setting, the LDO 304 will operate in saturation as near as possible to the interface point between the triode and saturation region of the LDO 304.

Based on the programmed current level $I_n$ determined for each LED channel n, the luminance controller 310 determines a PWM duty cycle (PWM_out$_n$) for each LED channel n using the following equation:

$$\text{PWM\_out}_n = BI_n \frac{Iset}{I_n} \quad (1)$$

where $BI_n$ is the baseline duty cycle representing the desired relative brightness setting for the channel n and Iset is the predefined master current level. Equation (1) scales this baseline duty cycle by the compensation factor $$\frac{Iset}{I_n}$$

to compensate for the current variations between channels and maintain the desired relative brightness. During normal operation, luminance controller drives the PWM switch $Q_P$ via control signal 308 according to PWM_out$_n$ for the channel n.

An example is now provided to further illustrate operation of the luminance controller 310. In this example, the PWM brightness input 317 sets the relative brightness $BI_n$ of each channel n to 60% brightness and sets the master current setting Iset to 40 mA. During the calibration stage described above, the luminance controller 310 determines programmed current levels for each LED channel and sets the programmed current levels via control signal 309 and DACs 307. In this example, the luminance controller 310 sets a first LED channel to a current level of $I_1$=46 mA, a second LED channel to a current level of $I_2$=40 mA and a third LED channel to a current level of $I_3$=42 mA such that each LED channel operates near but below their saturation points. The luminance controller 310 applies equation (1) to the programmed current levels to determine the duty cycles PWM_out$_n$ for each LED channel n as follows:

$$\text{PWM\_out}_1 = BI_1 \frac{Iset}{I_1} = 60\% \frac{40 \text{ mA}}{46 \text{ mA}} = 52.2\% \quad (2)$$

$$\text{PWM\_out}_2 = BI_2 \frac{Iset}{I_2} = 60\% \frac{40 \text{ mA}}{40 \text{ mA}} = 60\% \quad (3)$$

$$\text{PWM\_out}_3 = BI_3 \frac{Iset}{I_3} = 60\% \frac{40 \text{ mA}}{42 \text{ mA}} = 57.1\% \quad (4)$$

Thus, the calibration process determines currents $I_n$ and duty cycles PWM_out$_n$ for each LED channel n. Beneficially, each LED channel will have the same average current (PWM_out$_n$×$I_n$=24 mA). Therefore, the observed brightness of each LED channel will be well matched because brightness output is closely related to the average current through the LED channel.

If the relative brightness inputs $BI_n$ are set differently for different channels n, then equation (1) ensures that the ratio between the average currents of different channels matches the ratio between the brightness inputs. For example, if a fourth channel is configured for a brightness input $BI_4$=75% and a fifth channel is configured for a brightness input $BI_5$=25%, then the luminance controller 310 calibrates the channels such that the ratio of average currents between the fourth and fifth channel is 3:1.

Figure 1:
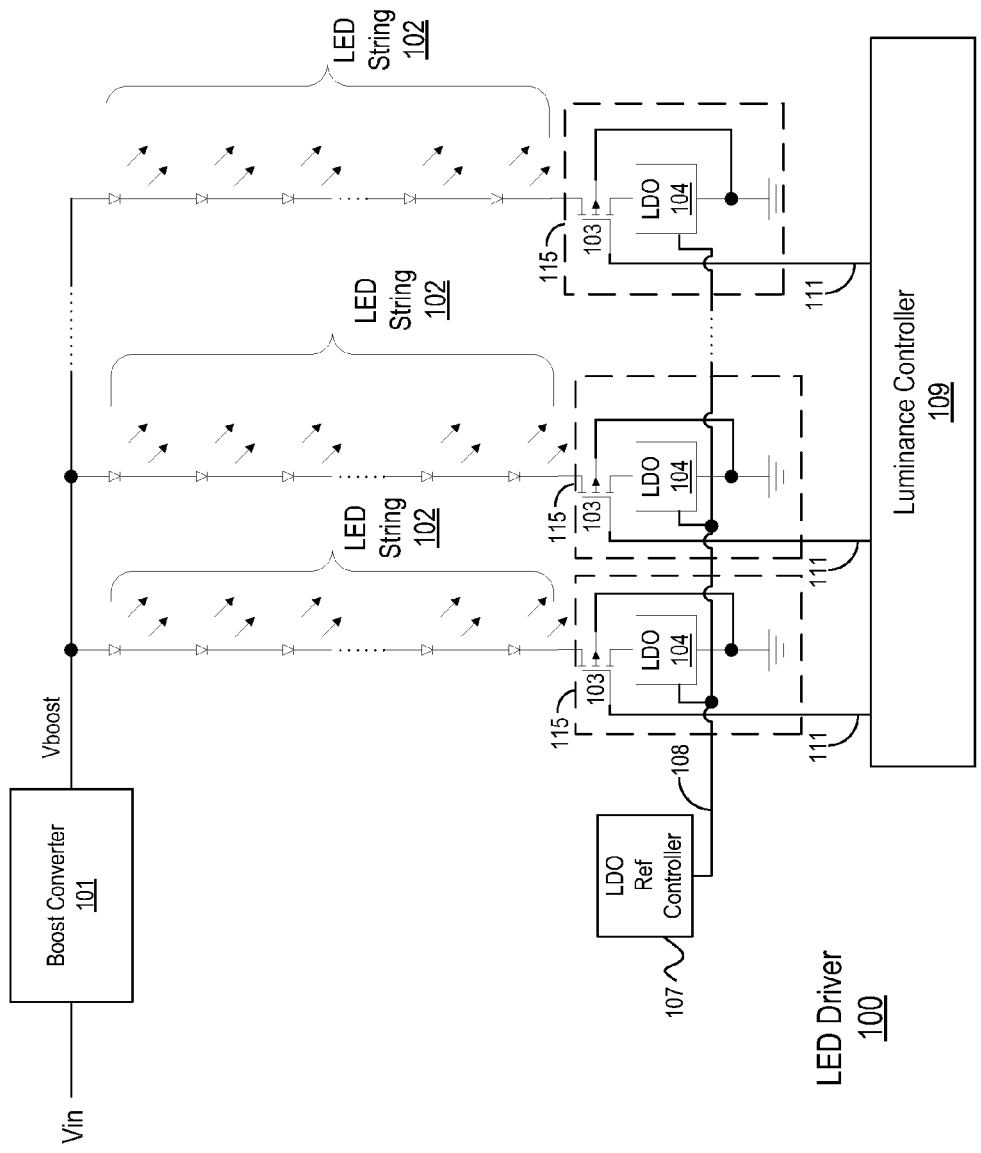
FIG. 1 is a circuit diagram illustrating a conventional multi-string LED driver.
Figure 2:
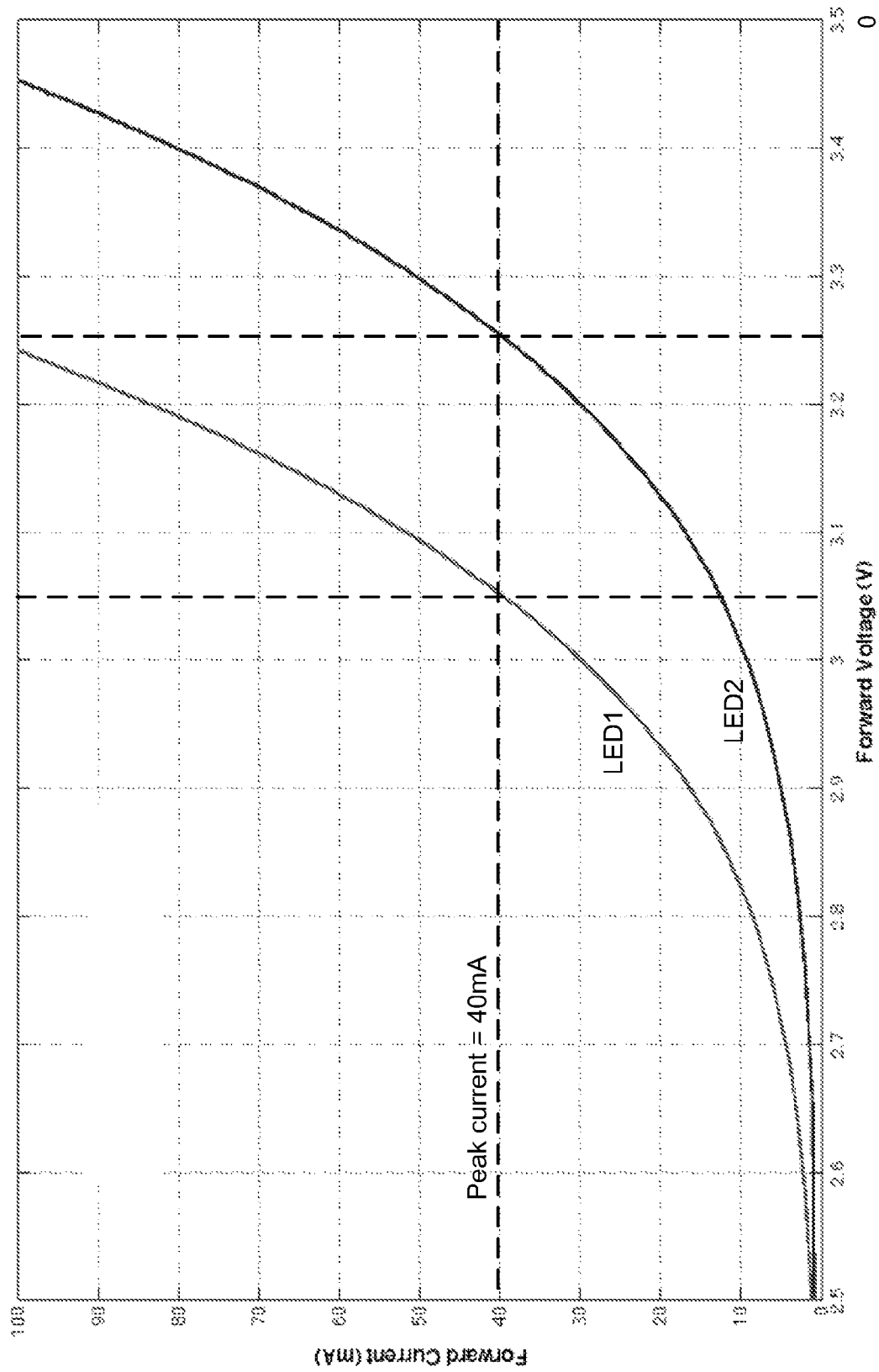
FIG. 2 is a plot illustrating the effects of the manufacturing differences on the I-V curves of forward biased LEDs.
Figures 4A, 4B:
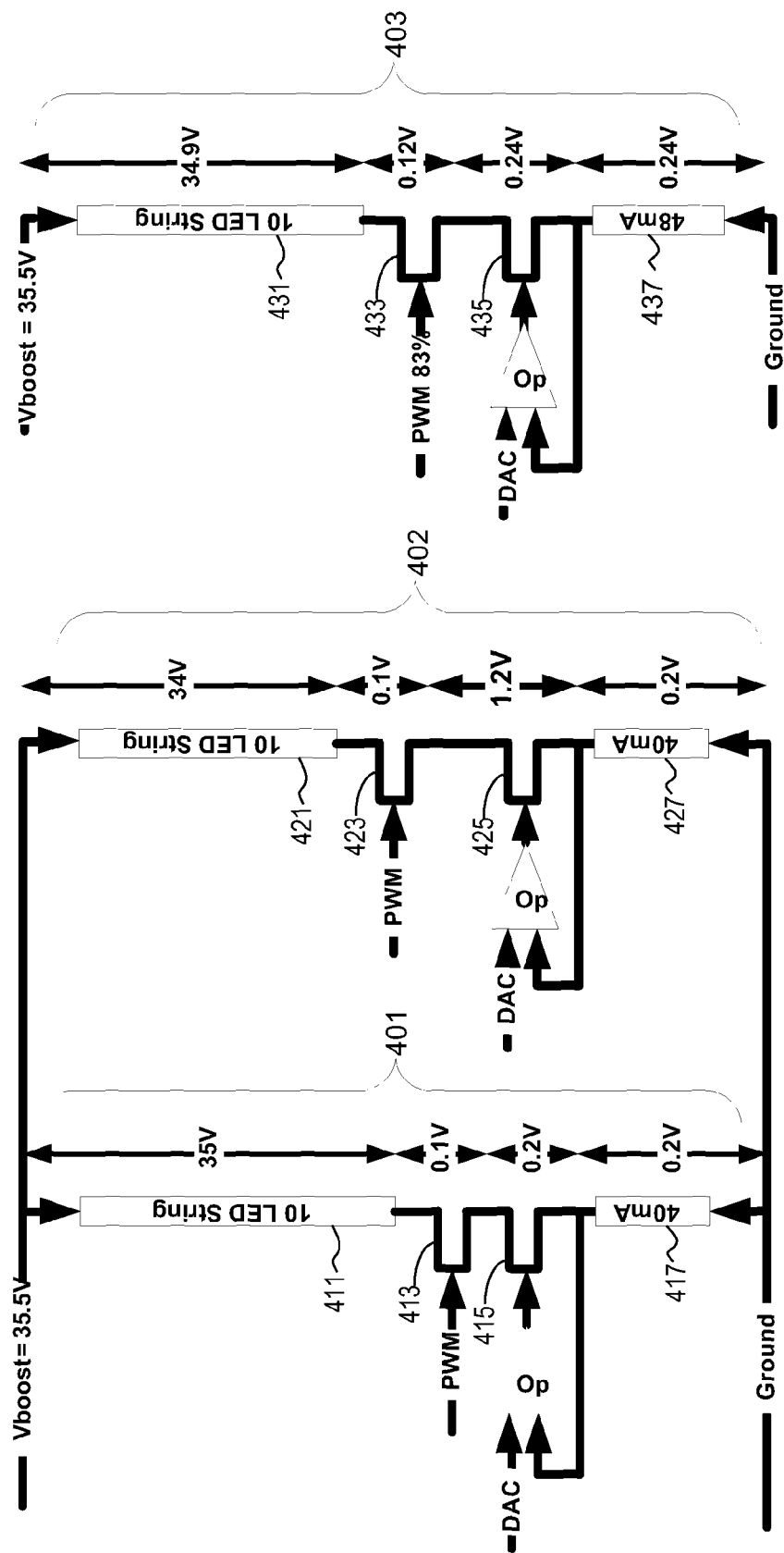
FIGS. 4A and 4B are power loss diagrams showing the difference in power dissipation between the conventional analog LDO LED driver in FIG. 4A and the adaptive switch model LED driver of the present invention in FIG. 4B.

FIGS. 4A and 4B illustrate the power loss differences between the traditional LDO-based LED driver 100 of FIG. 1 and the adaptive switch mode LED driver 300 of the present invention. In the first LED channel 401 of FIG. 4A, Vboost is adjusted to 35.5 volts to obtain a current of 40 mA through the LED channel 401. LDO transistor 415 drops 0.2 volts and PWM transistor 413 drops 0.1 volts. LED string 411 has a voltage drop of 35.0 volts at 40 mA. In the second LED channel 402, LED string 421 instead has a voltage drop of 34.0 volts at 40 mA due to manufacturing variations between LED string 411 in the first LED channel 401 and LED string 421 in the second LED channel 402. Using the traditional LDO approach, LDO 425 drops the additional volt for a total of 1.2 volts. The total power dissipated by the PWM transistor 423, LDO transistor 425, and sense resistor 427 in the second LED channel 402 using the traditional LDO approach is 60 mW. This wasted power causes undesired heat in a multi-string LED driver.

A third LED channel 403 in FIG. 4B illustrates the benefits of the adaptive approach of the present invention. Assume that the characteristics of LED string 431 in the third LED channel 403 are identical to LED string 421 in the second LED channel 402. However, this LED channel 403 is instead driven using the adaptive switch mode LED driver 300 of the present invention. Using the calibration process described above, luminance controller 310 will set the current in the third LED channel 403 to 48 mA so that the LDO regulator is operating near but below the point of saturation. There is an increased voltage drop across LDO transistor 435, PWM transistor 423, and sense resistor 427 proportional to the increased current. Applying equation (1), the PWM duty cycle is adjusted to 83%. Using the adaptive approach of the present invention, the total power dissipated by the PWM transistor 433, LDO transistor 435, and sense resistor 437 is only 28.8 mW. Thus, LED driver 300 provides a substantial improvement in power efficiency over the traditional LDO driver 100. LED driver 300 also provides advantages over the full digital switch approach described in U.S. patent application Ser. No. 12/164,909 by Yuhui Chen, et al., referenced above, because luminance controller 310 allows only a limited range of possible channel currents. This eliminates the problems with component stress and reliability caused by wide dynamic range of currents between LED channels.

Alternative Embodiments of LDO Driver

Figure 5:
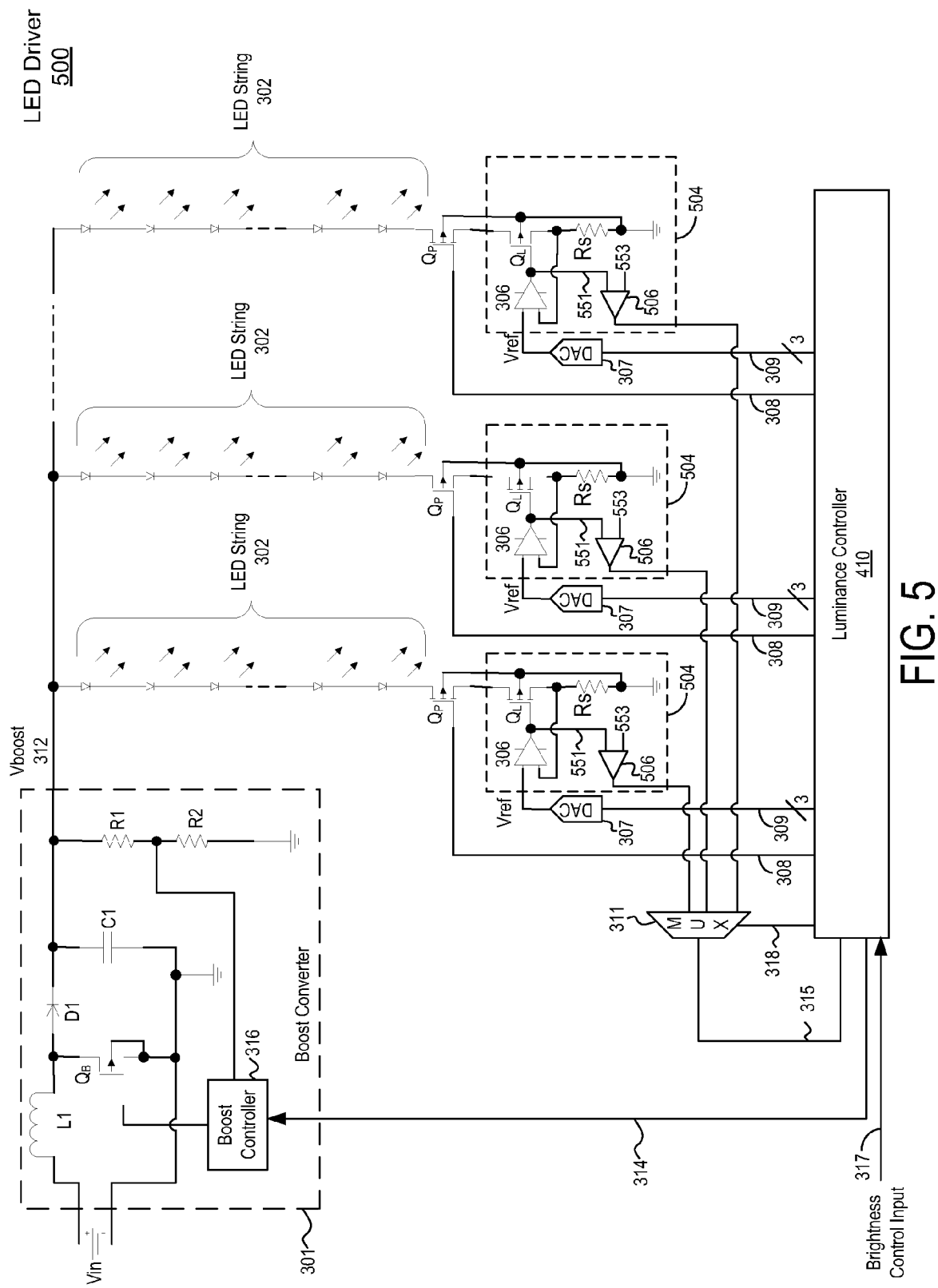
FIG. 5 is a circuit diagram illustrating an adaptive switch mode LED driver according to a second embodiment of the present invention.

FIG. 5 illustrates a second embodiment of an adaptive switch mode LED driver 500. LED driver 500 is similar to LED driver 300 of FIG. 3 described above, but includes a modified LDO 504 and lacks ADC 313. LDO 504 includes op-amp 306, pass transistor $Q_L$, and sense resistor $R_S$ in an LDO configuration similar to that of LDO 304 described above. However, LDO 504 additionally includes a comparator 506 that compares the output 551 of op-amp 306 to a reference voltage 553 and outputs the resulting signal to the multiplexer 311. In other alternative embodiments, input 551 to comparator 506 can be coupled to the drain or source of LDO transistor $Q_L$ instead of to the output of op-amp 306.

In the embodiment of FIG. 5, luminance controller 310 applies a modified calibration process to determine the programmed current $I_n$ and duty cycle PWM_out$_n$ for each LED channel. During the calibration stage, DACs 307 are all initialized to their lowest level. Vboost is then incrementally increased by control signal 314 until the LED channels all operates at or above the desired Iset level. Once Vboost reaches the proper level, luminance controller 310 sequences DACs 307 for each LED channel from their lowest level to their highest level and monitors the outputs from comparators 506 via multiplexer 311. When the DAC output become too high for LDO 504 to maintain the current at the programmed level, the output of comparator 506 ramps up and exceeds a threshold voltage 553. Luminance controller 310 stores the highest possible DAC setting for each LED channel before the threshold voltage 553 is exceeded as the current level $I_n$ for the LED channel n.

The embodiment of FIG. 5 has the benefit of ensuring that each LDO 504 operates as close to the interface point between the triode and saturation region as possible without going into deep saturation. This guarantees minimal power dissipation in each LDO 504 while still maintaining precise regulation. Following calibration, LED driver 500 operates identically to the LED driver 300 of FIG. 3.

Luminous Transfer Function Compensation

Figure 6:
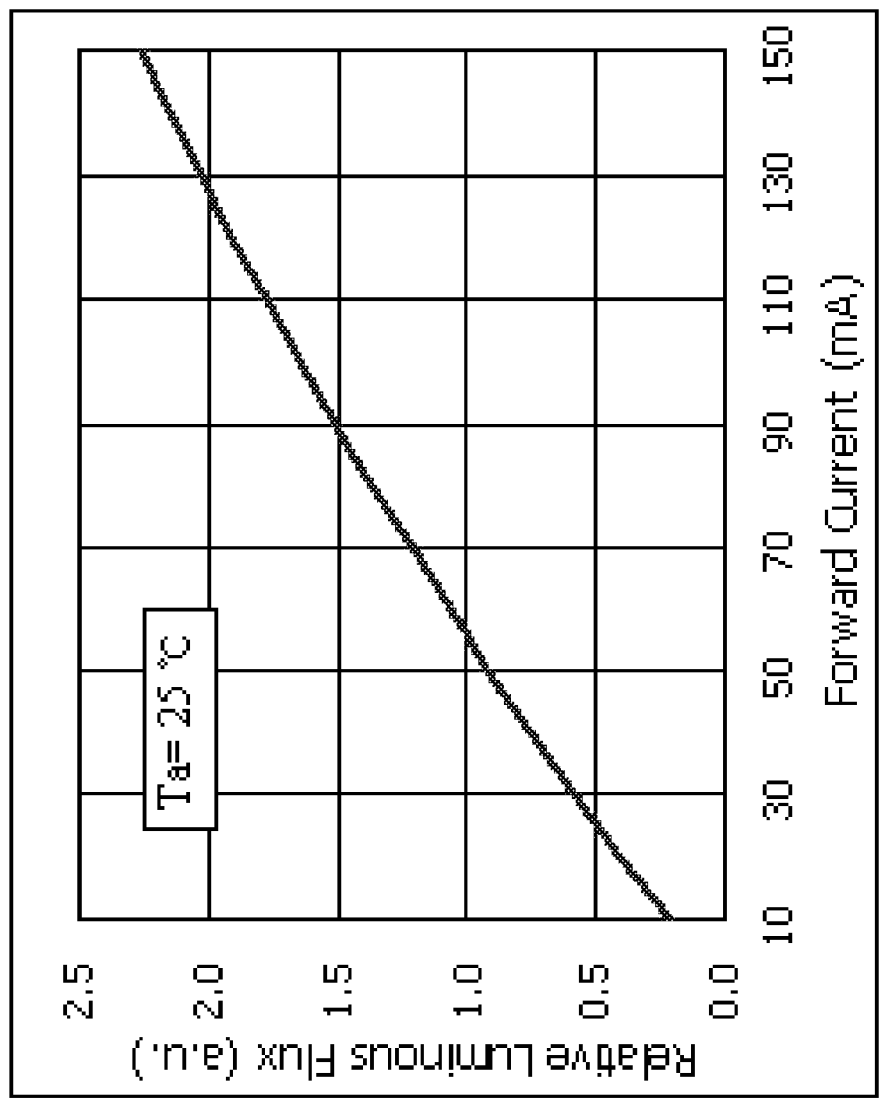
FIG. 6 is a plot illustrating a typical nonlinear transfer function between electrical current and optical luminance for a typical LED.

In an alternative embodiment, luminance controller 310 applies a modified version of equation (1) to account for non-linearity in the relationship between the luminous flux and the forward current of the LEDs. FIG. 6 is a plot of the relative luminous flux emitted from a forward conducting LED as a function of current. The plot illustrates that the optical efficiency drops as the forward current increases, and this causes a slight reduction in the slope. In one embodiment, luminance controller 310 models the luminance transfer function using a second ordered polynomial of the following form:

$$\text{lum}(x) = c_2 x^2 + c_1 x + c_0 \quad (5)$$

where the $c_0$, $c_1$, and $c_2$ are experimentally determined constants. In this embodiment, luminance controller 310 applies the following compensation equation to determine PWM_out$_n$ for each LED channel n:

$$\text{PWM\_out}_n = BI_n \frac{lum(Iset)}{lum(I_n)} \quad (6)$$

In contrast to equation (1) above which matches the ratio of average currents between LED channel to the ratio of the brightness inputs $BI_n$, equation (6) instead sets the relative luminous flux output of an LED channel proportionally to the relative brightness $BI_n$. This provides for more precise maintenance of the relative brightness outputs between LED channels. Thus, LED channels configured with the same brightness inputs will have substantially the same brightness outputs.

In one embodiment, luminance controller 310 evaluates the ratio $$\frac{lum(Iset)}{lum(I_n)}$$

for each LED channel n during the calibration stage, and stores the results in memory. During real-time operation, luminance controller 310 only needs to perform the one remaining multiply operation of equation (6) whenever brightness input 317 is updated. In one embodiment, luminance controller 310 comprises a single digital logic multiplier/divider arithmetic unit that is shared by all LED channels. In this embodiment, equation (6) is applied sequentially for each LED channel. Beneficially, this multiplier/divider can be optimized for size instead of speed, thereby reducing the cost of the implementation.

Temperature Compensation

Figure 7:
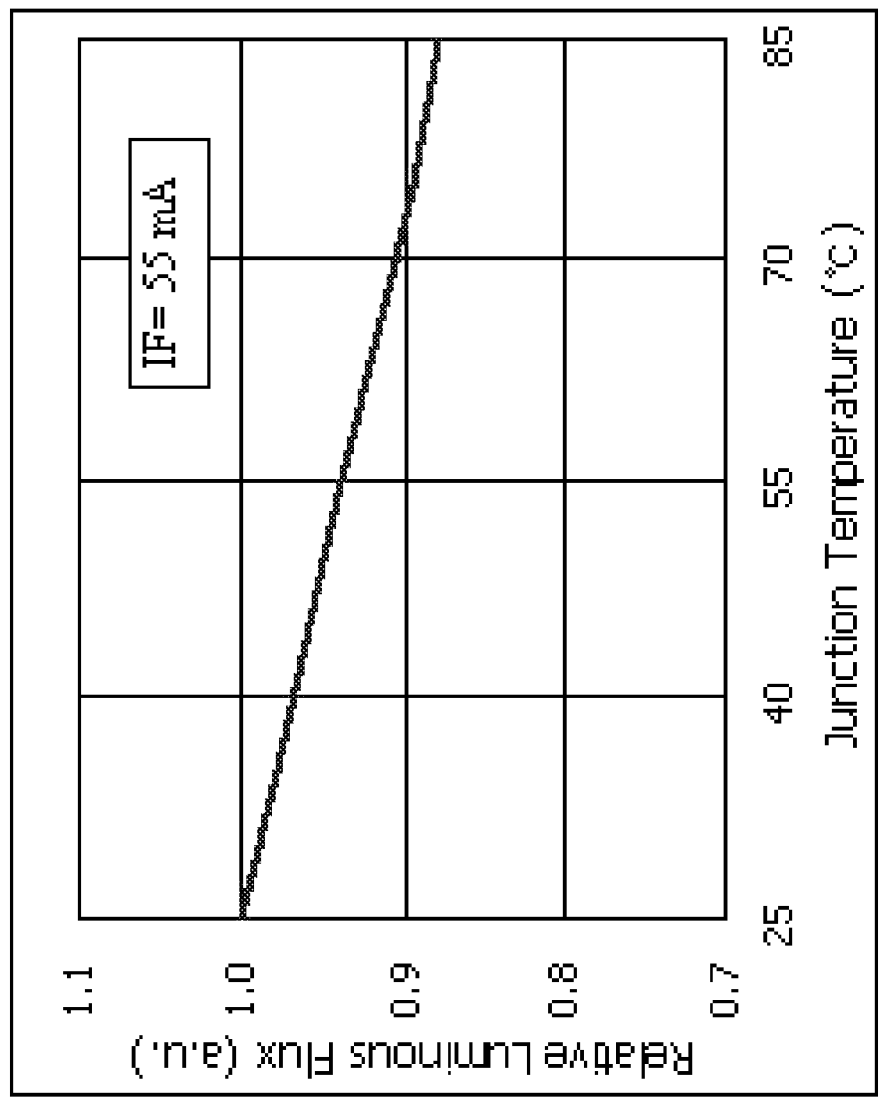
FIG. 7 is a plot illustrating a typical temperature de-rating of luminous flux density as a function of junction temperature for a typical LED.

In another alternative embodiment, luminance controller 310 applies a different modified version of equation (1) that additionally provides compensation for temperature variations between the LED channels. FIG. 7 is a plot of the relative luminous flux density emitted from a forward biased LED with 55 mA forward current as a function of junction temperature. The plot illustrates an approximately 12% reduction in luminance as the junction temperature of the LEDs is raised from 25 to 85 degrees centigrade. This reduction is a substantially linear function of temperature. Thus, in one embodiment luminance controller 310 applies the following equation to determine PWM_out$_n$ for each LED channel n:

$$\text{PWM\_out}_n = BI_n \frac{lum(Iset)}{lum(I_n)C_T} \quad (7)$$

where $C_T$ is an experimentally determined linear function of temperature. In this embodiment, luminance controller 310 is modified to include an additional temperature input signal (not shown) configured to provide temperature data to luminance controller 310. The temperature data can be obtained using any conventional LED temperature measurement techniques.

Sample and Hold Circuit

Figure 8:
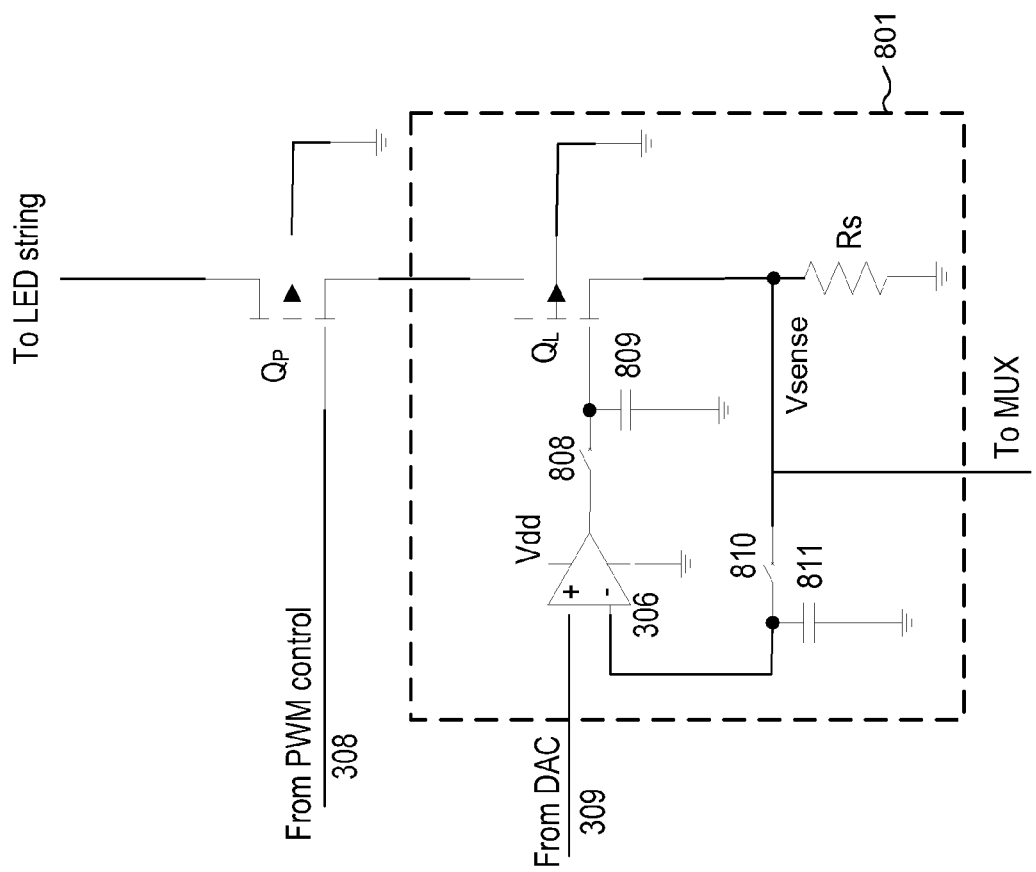
FIG. 8 is a circuit diagram of a sample and hold LDO according to a third embodiment of the present invention.

FIG. 8 is a circuit diagram illustrating an embodiment of an LDO 801 that includes a sample and hold feature. For clarity and convenience, the sample and hold LDO 801 is illustrated as a modified version of LDO 304 and is compatible with LDO driver 300 of FIG. 3. However, LDO 504 of FIG. 5 could also be modified to include the sample and hold features of LDO 801 described below. Thus, the sample and hold features are also compatible with LDO driver 500 of FIG. 5.

Sample and hold LDO 801 includes all of the components of LDO 304 described above, but additionally includes capacitors 809, 811, and switches 808, 810. A first sample and hold component comprising sample/hold switch 808 and capacitor 809 are coupled between the output of op-amp 306 and the gate of transistor $Q_L$. A second sample and hold component comprising sample/hold switch 810 and capacitor 811 are coupled in the negative feedback path between sense resistor $R_S$ and the input of op-amp 306. This sample and hold feature allows LDO 801 to operate continuously even though its current is interrupted whenever the PWM control transistor $Q_P$ turns off. Switches 808, 810 are digitally controlled via additional control signals (not shown) from luminance controller 310.

In operation, luminance controller 310 opens switches 808, 810 just before PWM switch $Q_P$ is turned off. Capacitors 809, 811 maintain the gate-source voltage of transistor $Q_L$ and the voltage at the negative input of the operational amplifier 306 at constant levels for the off-time of PWM switch $Q_P$. Switches 808, 810 and capacitors 809, 811 beneficially prevent the output of op-amp 306 from driving the gate of LDO transistor $Q_L$ to near the Vdd rail whenever PWM switch $Q_P$ is off. This prevents current spikes through the LED strings 302 at the leading edge of every PWM cycle by ensuring that op-amp 306 is already at or near the correct value when PWM switch $Q_P$ turns on. Just after PWM switch $Q_P$ turns back on, luminance controller 310 closes switches 808, 810 and resumes continuous time linear regulation. The sample and hold feature allows LDO 801 to operate over extreme duty cycles with very fast dynamic response.

Fault Detection Circuit

Figure 9:
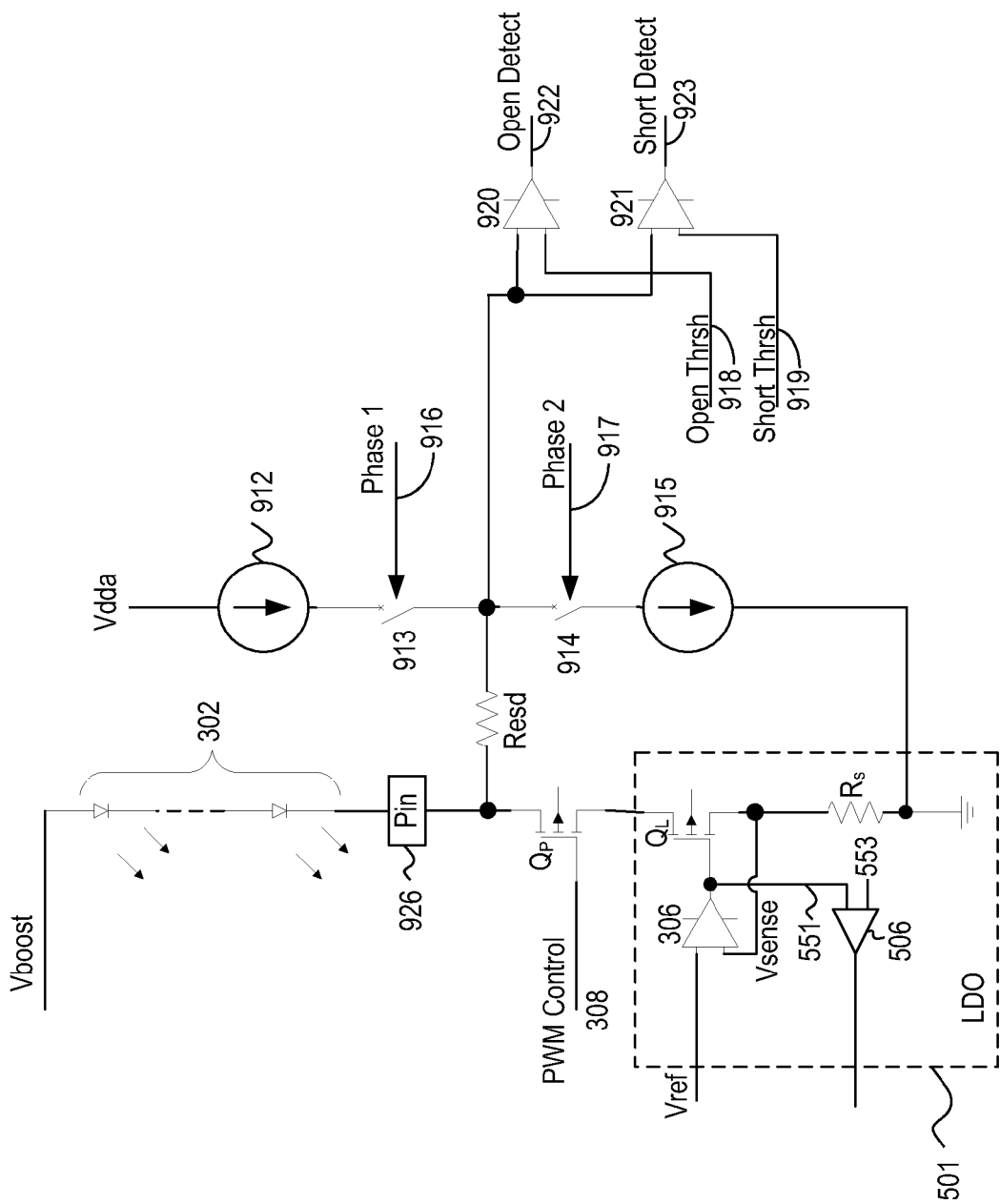
FIG. 9 is a circuit diagram of a startup fault detection circuit according to a fourth embodiment of the present invention.

FIG. 9 illustrates an embodiment of a fault detection circuit for use with LED driver 300 or LED driver 500. Although FIG. 9 illustrates the fault detection circuit in the context of LDO 504, the features of the fault detection circuit can also be included in embodiments using LDO 304 or sample and hold LDO 801 described above.

The fault detection circuit comprises resistor $R_{ESD}$, current sources 912, 915, switches 913, 914, and comparators 920, 921. Current source 912, switch 913, and resistor $R_{ESD}$ are all coupled in series between analog voltage source Vdda and a test point such as, for example, drain pin 926 of PWM transistor $Q_P$. Current source 915, switch 914, and resistor $R_{ESD}$ are all coupled in series between the pin 926 and a ground terminal. Comparators 920 and 921 sense the voltage at drain pin 926 via resistor $R_{ESD}$ and compare the voltage to an open threshold voltage 918 and a short threshold voltage 919 respectively. In this embodiment, luminance controller 310 includes additional inputs and outputs 916, 917, 922, 923 (not illustrated in FIG. 3 and FIG. 4) to carry out the fault detection features. The fault detection circuit detects three types of faults: (1) "short type" faults at the drain pin 926 of the PWM transistor $Q_P$; (2) "open type" faults in the LED string 302; and (3) "LED short type" faults within the LED string 302. The operation of each type of fault protection is described below.

Short type faults are detected during a "short detection" test, typically performed during the power up sequence. During the pin short test, luminance controller 310 turn on (i.e. closes) switch 913 via phase 1 control signal 916 and turns off LDO transistor $Q_L$ and PWM transistor $Q_P$. Current source 912 attempts to supply a small current (e.g., approximately 100 µA) through resistor $R_{ESD}$ to drain pin 926. If there is a short on pin 926 to ground, then the voltage at pin 926 will drop to near zero volts. Otherwise, the voltage will rise to near the analog supply rail voltage Vdda. Pin 926 is monitored through resistor $R_{ESD}$ and compared to a short threshold voltage 919 by comparator 921. If the monitored voltage is below short threshold voltage 919, then the LED channel has a short from the pin 926 to ground. A short is indicated by short detection signal 923. In one embodiment, further operation of the LED channel is disabled when a short is detected. At the end of the pin short test, phase 1 control signal 916 turns off (i.e. opens) switch 913 and it remains off during normal operation.

Open type faults are detected during an "open detection" test that is also performed during the power up sequence. Luminance controller 310 turns on (i.e. closes) switch 914 via phase 2 control signal 917. Current source 915 attempts to draw a small current (e.g., approximately 100 µA) from pin 926 via resistor $R_{ESD}$. If LED string 302 is not properly connected to pin 926, then the voltage at pin 926 will fall to near zero volts. If LED string 302 is properly connected, then the leakage current through LED string 302 from Vboost will cause the voltage to rise. The voltage at pin 926 is monitored through resistor $R_{ESD}$ and compared to open threshold voltage 918 by comparator 920. If the monitored voltage falls below open threshold 918, then the luminance controller 310 determines that the LED channel has an open path from pin 926 to LED string 302. The open circuit is indicated by open detection signal 922. In one embodiment, further operation of the LED channel is disabled when an open type fault is detected. At the end of the test, switch 914 is turned off by phase 2 control signal 917 and it remains off during normal operation.

Tests for LED short type faults are performed periodically during normal operation. This test utilizes comparator 506 that is also used during the LED channel calibration stage. Comparator 506 monitors the output of the op-amp 306. If one or more LEDs in LED string 302 is shorted to ground, then the forward voltage drop of LED string 302 will decrease and the current in the LED channel will begin to rise. As the current rises, Vsense increases and output 551 of op-amp 306 drops. When output 551 falls below threshold voltage 553, comparator 506 changes states and indicates that LDO 504 is exceeding its regulation power limits. This indicates to luminance controller 310 that a LED short type failure has occurred. Operation of the failed LED channel can then be disabled.

Manufacturing Variation Compensation

Embodiments of the present invention also include a compensation for manufacturing variation in the silicon process. For example, in one embodiment, the on resistance (Rdson)

of an LED PWM switch $Q_P$ has a design target of 5 ohms with a 5V gate driver at typical process corner. The actual Rdson resistance of the switch $Q_P$ can be measured during an Automatic Testing Equipment (ATE) test stage. In one embodiment, the actual Rdson resistance is stored to a memory in the LED driver 300 (e.g., in the luminance controller 310) so that the luminance controller 310 can use the value in driving the LED strings. If the silicon for the switch $Q_P$ is in the slow process corner, this measured resistance will be higher than the targeted design value, resulting in higher thermal loss. In this case, the gate driver power supply that would normally be set to 5 volts for a typical process corner, is instead trimmed to higher voltage (e.g., 6V) to maintain the same target resistance of 5 ohms The same principle can also be applied to 3.3V gate driver circuit power supplies or other types of gate drivers.

If the silicon is in the fast process corner, the measured resistance will be lower than the targeted design value. Although the gate driver power supply could be trimmed to a lower voltage (e.g., 4V) to maintain the target resistance of 5 ohms, there is no obvious benefit to reducing the gate driver power supply. Therefore, in one embodiment, the adjustment is made only in the slow process corner but not in the fast process corner.

The disclosed method beneficially saves significant silicon area compared to traditional design methodology. Traditional design methodology chooses the w/l ratios of the transistors conservatively enough to cover all process corners. By calibrating the gate drive signal based on the measured on-resistance as described above, a less conservative w/l ratio can be implemented, thus saving silicon area and cost.

Upon reading this disclosure, those of skill in the art will appreciate still additional alternative designs for the adaptive switch mode LED driver. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A light-emitting diode (LED) driver for driving one or more LED strings, the LED driver comprising:
   a power converter configured to receive an input voltage and generate an output voltage applied to a first LED string;
   a first channel switch configured to switch the first LED string on or off according to a first duty cycle signal applied to the first channel switch;
   a first channel regulator configured to receive a first programmed current level signal and regulate current through the first LED string according to the first programmed current level signal; and
   a luminance controller configured to generate the first programmed current level signal for the first LED string to correspond to one of a limited set of programmable current levels, and generating the first duty cycle signal for driving the first channel switch as a function of the first programmed current level signal,
   wherein the first channel switch is coupled in between and in series with the first channel regulator and the first LED string.

2. A light-emitting diode (LED) driver for driving one or more LED strings, the LED driver comprising:
   a power converter configured to receive an input voltage and generate an output voltage applied to a first LED string;
   a first channel switch configured to switch the first LED string on or off according to a first duty cycle signal applied to the first channel switch;
   a first channel regulator configured to receive a first programmed current level signal and regulate current through the first LED string according to the first programmed current level signal, wherein the first channel regulator comprises:
      a pass transistor coupled in series with the first LED string and the first channel switch; and
      a feedback loop configured to sense the current through the first LED string, compare the sensed current to an analog current reference, and control the pass transistor to reduce the sensed current responsive to the sensed current exceeding the analog current reference; and
   a luminance controller configured to generate the first programmed current level signal for the first LED string to correspond to one of a limited set of programmable current levels, and generating the first duty cycle signal for driving the first channel switch as a function of the first programmed current level signal.

3. The LED driver of claim 1, wherein the first channel switch is coupled in series with the first LED string.

4. The LED driver of claim 1, wherein the luminance controller generates the first programmed current level to be a highest one of the limited set of programmable current levels at which the current through the first LED string can be regulated by the first channel regulator under the output voltage applied to the first LED string.

5. The LED driver of claim 1, wherein generating the first duty cycle signal comprises:
   determining a ratio of the first programmed current level signal to a baseline current level; and
   multiplying the ratio by a baseline duty cycle.

6. The LED driver of claim 1, further comprising:
   a second channel switch configured to switch a second LED string on or off according to a second duty cycle signal applied to the second channel switch, the second LED string having different current-voltage characteristics than the first LED string;
   a second channel regulator configured to receive a second programmed current level signal from the luminance controller and regulate current through the second LED string according to the second programmed current level signal, wherein the first and second programmed current level signals correspond to different programmed current levels; and
   wherein the luminance controller is further configured to generate the second programmed current level signal for the second LED string to correspond to another one of the limited set of programmable current levels, and to determine the second duty cycle signal for driving the second channel switch as a function of the second programmed current level signal.

7. The LED driver of claim 6, wherein the first and second LED strings are switched on or off according to different programmed current levels and different duty cycles but have substantially same average current levels.

8. The LED driver of claim 2, wherein the feedback loop comprises:
- a sense resistor coupled in series to a source of the pass transistor; and
- an operational amplifier having a negative input terminal coupled to the source of the pass transistor, a positive input terminal coupled to receive the analog current reference, and an output terminal coupled to a gate of the pass transistor.

9. The LED driver of claim 8, further comprising:
- a comparator configured to compare an output of the operational amplifier to a reference voltage for detecting when the sensed current exceeds the programmed current level signal and output a comparison signal to the luminance controller.

10. The LED driver of claim 9, wherein the luminance controller determines that an LED in the first LED string is shorted to ground responsive to the comparison signal indicating that the sensed current exceeds the programmed current level signal during normal operation of the LED driver following calibration.

11. The LED driver of claim 8, wherein the first channel regulator comprises a sample and hold regulator including:
- a first sample and hold component for sampling an output voltage of the operational amplifier prior to the first channel switch turning off, and holding the output voltage of the operational amplifier until the first channel switch turns back on; and
- a second sample and hold component for sampling a negative input terminal voltage of the operational amplifier prior to the first channel switch turning off, and holding the sampled negative input terminal voltage until the first channel switch turns back on.

12. The LED driver of claim 2, further comprising:
- a digital-to-analog converter (DAC) configured to receive the programmed current level signal in digital form from the luminance controller and output the analog current reference to the first channel regulator.

13. The LED driver of claim 1, further comprising:
- a feedback path transmitting a feedback signal from the first channel regulator representative of a sensed current through the first channel regulator to the luminance controller,
- wherein the luminance controller generates the first programmed current level signal based in part on the feedback signal.

14. The LED driver of claim 1, wherein the luminance controller generates the first duty cycle signal as a function of the first programmed current level signal such that average current is substantially matched between each of the one or more LED strings configured for a same relative brightness with respect to a maximum brightness of each of the one or more LED strings.

15. The LED driver of claim 1, wherein the luminance controller determines the first duty cycle signal as a function of the first programmed current level signal based in part on a luminance transfer function such that luminous flux is substantially matched between at least some of the LED strings configured for a same relative brightness with respect to a maximum brightness of each of the one or more LED strings.

16. The LED driver of claim 15, wherein the luminance controller further comprises a temperature input receiving a temperature measurement, and wherein the luminance transfer function includes a temperature compensation function for compensating for temperature variations between the one or more LED strings.

17. A light-emitting diode (LED) driver for driving one or more LED strings, the LED driver comprising:
- a power converter configured to receive an input voltage and generate an output voltage applied to a first LED string;
- a first channel switch configured to switch the first LED string on or off according to a first duty cycle signal applied to the first channel switch;
- a first channel regulator configured to receive a first programmed current level signal and regulate current through the first LED string according to the first programmed current level signal; and
- a luminance controller configured to generate the first programmed current level signal for the first LED string to correspond to one of a limited set of programmable current levels, and generating the first duty cycle signal for driving the first channel switch as a function of the first programmed current level signal;
- a fault detection circuit for detecting at least one of an open circuit and a short circuit in the one or more LED strings, and turning off the first channel switch to disable the first LED string responsive to detecting the open circuit or the short circuit, wherein the fault detection circuit comprises:
  - a first current source supplying a first test current to the first channel regulator during a short circuit detection test;
  - a first comparator comparing a test point voltage of the first channel regulator to a short threshold voltage, wherein the first comparator indicates the short circuit responsive to the test point voltage exceeding the short threshold voltage;
  - a second current source drawing a second test current from the first channel regulator during an open circuit detection test; and
  - a second comparator comparing the test point voltage to an open circuit threshold voltage, wherein the second comparator indicates the open circuit responsive to the test point voltage falling below the open circuit threshold voltage.

18. A method for driving a first LED string from a set of one or more LED strings in a power converter configured to receive an input voltage and generate an output voltage applied to the first LED string, the method comprising:
- selecting, by a luminance controller, a first programmed current level for the first LED string from a limited set of programmable current levels;
- regulating, by a first channel regulator, current through the first LED string according to the first programmed current level;
- determining, by the luminance controller, a first duty cycle for switching the first LED string as a function of the first programmed current level; and
- switching the first LED string on or off according to the first duty cycle by controlling switching of a first channel switch coupled in between and in series with the first channel regulator and the first LED string.

19. The method of claim 18, wherein selecting the first programmed current level for the first LED string comprises:
- adjusting a supply voltage to the one or more LED strings such that a weakest string of the one or more LED strings operate at a baseline current; and
- selecting the first programmed current level for the first LED string as corresponding to a highest programmable current level at which the first LED string maintains regulation of the programmed current level.

20. The method of claim 18, wherein selecting the first programmed current level for the first LED string comprises:
- configuring each of the one or more LED strings to operate at a maximum current from the set of programmable current levels;
- adjusting a supply voltage to the one or more LED strings such that each of the one or more LED strings operate at or above a baseline current;
- sampling a sensed current through the first LED string;
- rounding the sensed current down to a nearest one of the set of programmable current levels; and
- storing the nearest one of the set of programmable current levels.

21. The method of claim 18, wherein selecting the programmed current level comprises:
- configuring each of the one or more LED strings to operate at a minimum current from the set of programmable current levels;
- adjusting a supply voltage to the one or more LED strings such that each of the one or more LED strings operate at or above a baseline current;
- monitoring a feedback signal indicating whether or not a regulator regulating the first LED string is operating in saturation;
- responsive to the feedback signal indicating that the regulator is operating in saturation, increasing the programmed current level for the first LED string; and
- storing a highest programmed current level under which the regulator operates in saturation.

22. The method of claim 18, wherein determining the first duty cycle for switching the first LED string comprises:
- determining the first duty cycle such that average currents substantially match through each of the one or more LED strings configured for a same relative brightness with respect to a maximum brightness of each of the one or more LED strings.

23. The method of claim 18, wherein determining the first duty cycle for switching the first LED string comprises:
- determining the first duty cycle based in part on a luminance transfer function such that luminous flux outputted substantially matches from each of the one or more LED strings configured for a same relative brightness with respect to a maximum brightness.

24. The method of claim 23, wherein the luminance transfer function includes a temperature compensation function for compensating for temperature variations between each of the one or more LED strings.

25. A method for driving a first LED string from a set of one or more LED strings in a power converter configured to receive an input voltage and generate an output voltage applied to the first LED string, the method comprising:
- selecting, by a luminance controller, a first programmed current level for the first LED string from a limited set of programmable current levels;
- regulating, by a first channel regulator, current through the first LED string according to the first programmed current level, where regulating the current comprises: sensing via a feedback loop, the current through the first LED string; comparing the sensed current to an analog current reference; and controlling a pass transistor to reduce the sensed current responsive to the sensed current exceeding the analog current reference, the pass transistor coupled in series with the first LED string and a first channel switch;
- determining, by the luminance controller, a first duty cycle for switching the first LED string as a function of the first programmed current level; and
- switching the LED string on or off according to the first duty cycle by controlling switching of the first channel switch.

26. A method for driving a first LED string from a set of one or more LED strings in a power converter configured to receive an input voltage and generate an output voltage applied to the first LED string, the method comprising:
- selecting, by a luminance controller, a first programmed current level for the first LED string from a limited set of programmable current levels;
- regulating, by a first channel regulator, current through the first LED string according to the first programmed current level;
- determining, by the luminance controller, a first duty cycle for switching the first LED string as a function of the first programmed current level; and
- switching the LED string on or off according to the first duty cycle by controlling switching of a first channel switch;
- detecting, by a fault detection circuit, at least one of an open circuit and a short circuit in the one or more LED strings, and turning off the first channel switch to disable the first LED string responsive to detecting the open circuit or the short circuit, wherein detecting comprises:
  - supplying a first test current to the first channel regulator during a short circuit detection test;
  - comparing a test point voltage of the first channel regulator to a short threshold voltage,
  - indicating that a short circuit is detected responsive to the test point voltage exceeding the short threshold voltage;
  - drawing a second test current from the first channel regulator during an open circuit detection test;
  - comparing the test point voltage to an open circuit threshold voltage; and
  - indicating that the open circuit is detected responsive to the test point voltage falling below the open circuit threshold voltage.

* * * * *